(12) United States Patent
Holzmann et al.

(10) Patent No.: US 6,301,161 B1
(45) Date of Patent: Oct. 9, 2001

(54) PROGRAMMING FLASH MEMORY ANALOG STORAGE USING COARSE-AND-FINE SEQUENCE

(75) Inventors: Peter J. Holzmann, Campbell; James Brennan, Jr., Saratoga; Albert Kordesch, San Jose, all of CA (US)

(73) Assignee: Winbond Electronics Corporation, Hsinchu (TW)

( * ) Notice: Subject to any disclaimer, the term of this patent is extended or adjusted under 35 U.S.C. 154(b) by 0 days.

(21) Appl. No.: 09/558,432

(22) Filed: Apr. 25, 2000

(51) Int. Cl.[7] .................................................. G11C 16/04
(52) U.S. Cl. ............................ 365/189.07; 365/185.03; 365/185.33
(58) Field of Search ..................... 365/189.07, 189.01, 365/45, 168, 185.03, 185.33, 236

(56) References Cited

U.S. PATENT DOCUMENTS

| | | | |
|---|---|---|---|
| 5,220,531 | 6/1993 | Blyth et al. ........................... 365/189 |
| 5,623,436 | * 4/1997 | Sowards et al. ........................ 365/45 |
| 5,764,571 | * 6/1998 | Banks .............................. 365/189.01 |
| 5,903,487 | * 5/1999 | Wu et al. ............................... 365/45 |

\* cited by examiner

Primary Examiner—David Nelms
Assistant Examiner—David Lam
(74) Attorney, Agent, or Firm—Blakely, Sokoloff, Taylor & Zafman LLP

(57) ABSTRACT

The present invention is a method and apparatus to program a flash memory cell in an analog storage array. A read circuit reads a cell voltage of a flash memory cell. A comparator compares the read cell voltage with an input voltage representing an analog signal. The comparator generates first and second comparison results. A programming circuit generates a first program pulse corresponding to a first amplitude to iteratively program the flash memory cell based on the first comparison result. The programming circuit generates a second program pulse corresponding to a second amplitude less than the first amplitude to iteratively program the flash memory cell based on the first and second comparison results.

18 Claims, 5 Drawing Sheets

PROGRAMMING FLASH MEMORY ANALOG STORAGE USING COARSE-AND-FINE SEQUENCE

BACKGROUND

1. Field of the Invention

This invention relates to analog storage. In particular, the invention relates to analog non-volatile flash memory.

2. Description of Related Art

Analog storage has been used in a number of recording and playback applications. For example, U.S. Pat. No. 5,220,531 issued to Blyth and Simko describes an analog storage scheme using electrically erasable programmable read only memory (EEPROM). Such an analog storage typically has memory cells using floating gate technology. A memory cell of a floating gate device has a source, a drain, a gate, and a floating gate. The threshold between the gate and the source is determined or controlled by the charge on the floating gate. These memory cells are erased using Fowler-Nordheim tunneling by applying a high voltage, e.g., 21 Volts, on the gate, zero volt on the source, and zero volt on the drain. The memory cells are programmed using the same Fowler-Nordheim tunneling mechanism by applying a high voltage (e.g., 9 to 19 volts) on the drain, zero volts on the gate, and 6 volts on the source.

Existing techniques for programming analog storage cells have a number of drawbacks. First, the programming is slow because the iterative sequence uses constant program pulses having constant programming voltage. To achieve high accuracy, the programming voltage step size has to be sufficiently small. Iterative programming the memory cells using small programming voltage step size requires a large number of steps, resulting in slow programming time. Second, the programming is used for EEPROM memory cells, and therefore is not applicable for flash memory cells which have different programming requirements.

Therefore, there is a need to have an efficient and accurate technique to program flash memory cells.

SUMMARY

The present invention is a method and apparatus to program a flash memory cell in an analog storage array. A read circuit reads a cell voltage of a flash memory cell. A comparator compares the read cell voltage with an input voltage representing an analog signal. The comparator generates first and second comparison results. A programming circuit generates a first program pulse corresponding to a first amplitude to iteratively program the flash memory cell based on the first comparison result. The programming circuit generates a second program pulse corresponding to a second amplitude less than the first amplitude to iteratively program the flash memory cell based on the first and second comparison results.

In one embodiment, a counter determines number of program pulses applied to the flash memory cell. The programming circuit terminates programming the flash memory cell when the number of program pulses reaches a predetermined maximum count. The first comparison result indicates if the read cell voltage is greater than the input voltage by a predetermined amount. The second comparison result indicates if the read cell voltage is greater than the input voltage. The programming circuit terminates programming the flash memory cell when the read cell voltage is less than the input voltage according to the second comparison result.

BRIEF DESCRIPTION OF THE DRAWINGS

The features and advantages of the present invention will become apparent from the following detailed description of the present invention in which.

DESCRIPTION

Figure 1:
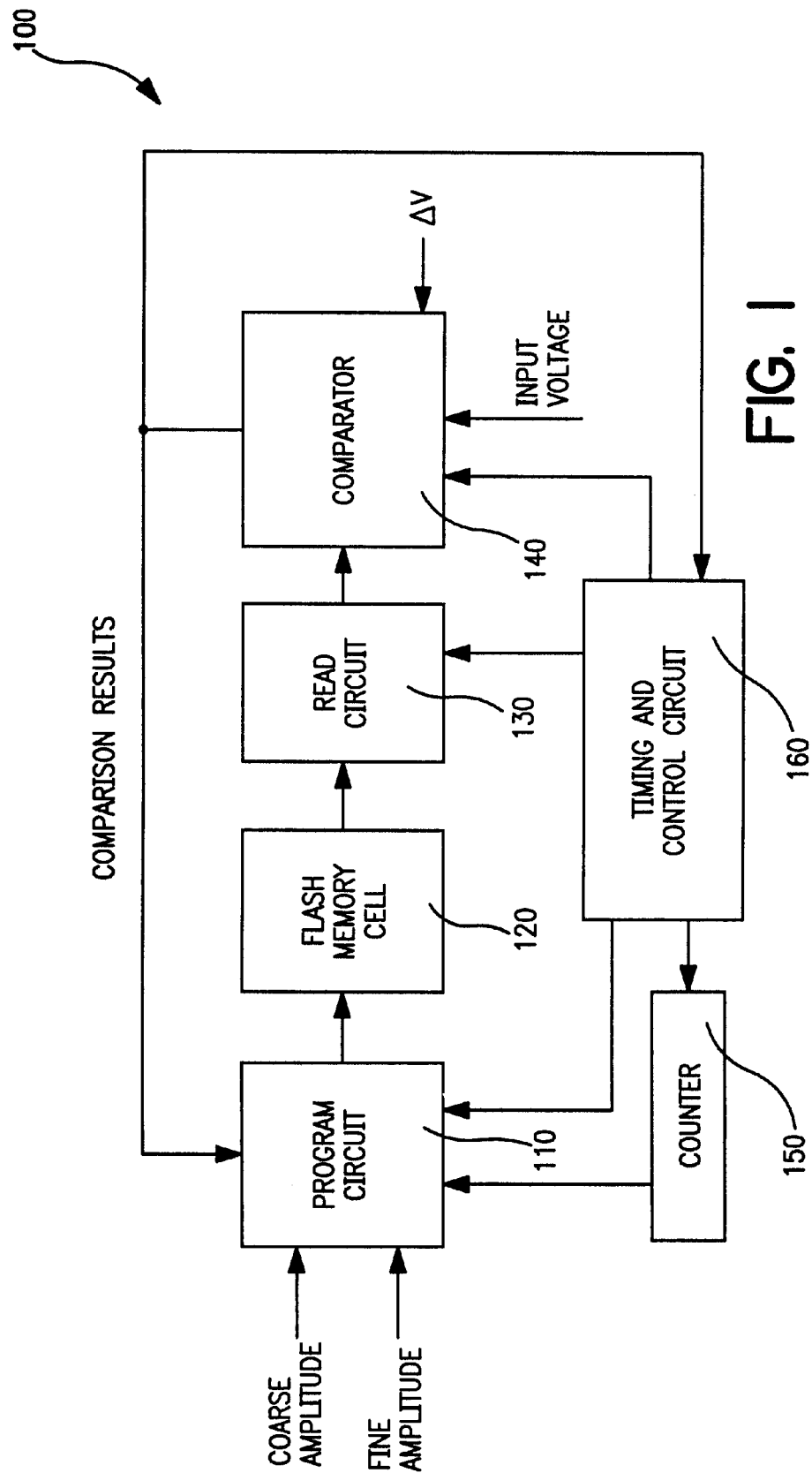
FIG. 1 is a diagram illustrating a circuit according to one embodiment of the invention.

The present invention is a method and apparatus to program a flash memory cell in an analog storage array. A read circuit reads a cell voltage of a flash memory cell. A comparator compares the read cell voltage with an input voltage representing an analog signal. The comparator generates first and second comparison results. A programming circuit generates a first program pulse corresponding to a first amplitude to iteratively program the flash memory cell based on the first comparison result. The programming circuit generates a second program pulse corresponding to a second amplitude less than the first amplitude to iteratively program the flash memory cell based on the first and second comparison results.

In one embodiment, a counter determines number of program pulses applied to the flash memory cell. The programming circuit terminates programming the flash memory cell when the number of program pulses reaches a predetermined maximum count. The first comparison result indicates if the read cell voltage is greater than the input voltage by a predetermined amount. The second comparison result indicates if the read cell voltage is greater than the input voltage. The programming circuit terminates programming the flash memory cell when the read cell voltage is less than the input voltage according to the second comparison result.

The first and second program pulses correspond to the coarse and fine program modes. By selecting proper coarse and fine amplitudes, the programming is fast and accurate. The coarse mode allows the read cell voltage to quickly approach the input voltage. As the read cell voltage is close to the input voltage, the programming is switched to the fine mode with fine amplitudes. When the comparison indicates that the read cell voltage is less than the input voltage, the fine programming is terminated. Therefore, the read cell voltage differs the input voltage by at most the fine program amplitude.

The coarse-and-fine programming technique is used to program flash memory cells in an analog storage array. Such an analog storage array is used in a number of applications including multi-level analog recording and playback systems.

In the following description, for purposes of explanation, numerous details are set forth in order to provide a thorough understanding of the present invention. However, it will be apparent to one skilled in the art that these specific details are not required in order to practice the present invention. In other instances, well-known electrical structures and circuits are shown in block diagram form in order not to obscure the present invention.

Non-volatile memory cells used in analog storage for recording and playback applications typically includes a floating gate device having a source, a drain, a gate and a floating gate. The threshold of the device as measured between the gate and the source of the device is determined, or controlled, by the charge on the floating gate. These cells are erased using Fowler-Nordheim tunneling by applying a high voltage, e.g., 15V on the gate, zero volts on the source, and zero volts on the drain. The high voltage on the gate capacitively couples to the floating gate, which creates a high electric field through the tunnel oxide between the floating gate and the drain. This electric field causes electrons to tunnel to the floating gate, which effectively raises the Vt (threshold voltage) to about 6V. In the present invention, the cell is programmed using a source side injection mechanism.

The program pulse is divided into a series of coarse pulses and a series of fine pulses to store an analog signal in the non-volatile memory cell. After each programming pulse, the content of the cell is read using a read cycle and compared with the analog signal to be stored. The coarse pulses terminate when the desired coarse programmed level is approached and the programming is then switched to the fine stage where fine pulses are provided. The fine pulses terminate when the desired programmed level is reached.

In the read mode, the storage cell is configured as a source follower with a constant load current from the source to ground. This results in a linear relationship between the threshold voltage of the cell and the cell readout voltage. The storage cell is operated in the saturation region.

FIG. 1 is a diagram illustrating a circuit 100 according to one embodiment of the invention. The circuit 100 includes a program circuit 110, a flash memory cell 120, a read circuit 130, a comparator 140, a counter 150, and a timing and control circuit 160. The circuit 100 programs the flash memory cell 120 by writing a cell voltage as close to the input voltage as possible to the flash memory cell.

The program circuit 110 generates programming pulses to the memory cell 120 during programming. The program circuit 110 generates coarse and fine pulses having coarse and fine amplitudes, respectively, using comparison results provided by the comparator 140. Coarse and fine amplitudes may correspond to voltage step size, current magnitude, or programming time magnitude. For example, when a memory cell is programmed, a program pulse is applied while the programming time is varied. A coarse amplitude may correspond to a large time step, and a fine amplitude may correspond to a small programming time. In one embodiment, the fine amplitude is less than the coarse amplitude. The program circuit 110 receives clocking signals and select signals to select the program pulse from the timing and control circuit 160.

The flash memory cell 120 is a memory cell in an analog memory array. The memory cell 120 is a floating-gate type having a source, a drain, a gate, and a floating gate.

The read circuit 130 reads the memory cell 120. In one embodiment, the read circuit 130 reads a cell voltage of the programmed or erased memory cell 120.

The comparator 140 compares the cell voltage as read by the read circuit 130 with the input voltage and generate comparison results. There are two comparison results: a coarse result and a fine result. The coarse result corresponds to comparing the read cell voltage with the input voltage plus a pre-determined amount $\Delta V$. Typically, this predetermined amount $\Delta V$ is slightly more than the coarse amplitude. The fine result corresponds to comparing the read cell voltage with the input voltage only. In one embodiment, the comparator 140 may be implemented as an operational amplifier having an offset that can be switched to ground or $\Delta V$.

In one embodiment of the present invention, the program circuit 110 generates the coarse pulse to program the memory cell 120 when the comparator 140 generates the coarse result indicating that the read cell voltage is greater than the input voltage plus $\Delta V$. The program circuit 110 generates the fine pulse to program the memory cell 120 when the comparator 140 generates the fine result indicating that the read cell voltage is greater than the input voltage. In a coarse-to-fine process, the program circuit 110 starts generating program pulse. The program pulse is increasing and the source-follower voltage is gradually decreasing to the low voltage as the cell voltage approaches the input voltage.

The counter 150 keeps track of the number of programming pulses provided by the program circuit 110. Each time the program circuit generate a program pulse to the memory cell 120, the counter 150 is incremented by one. When the counter 150 reaches a predetermined maximum count NMAX, the programming is terminated.

The timing and control circuit 160 generates timing signals (e.g., clocks) and control signals (e.g., program pulse select signals, voltage source select signals) to various elements in the circuit. The timing and control circuit 160 may receive the comparison results from the comparator 140 to generate appropriate control signals to the program circuit 110.

Figure 2:
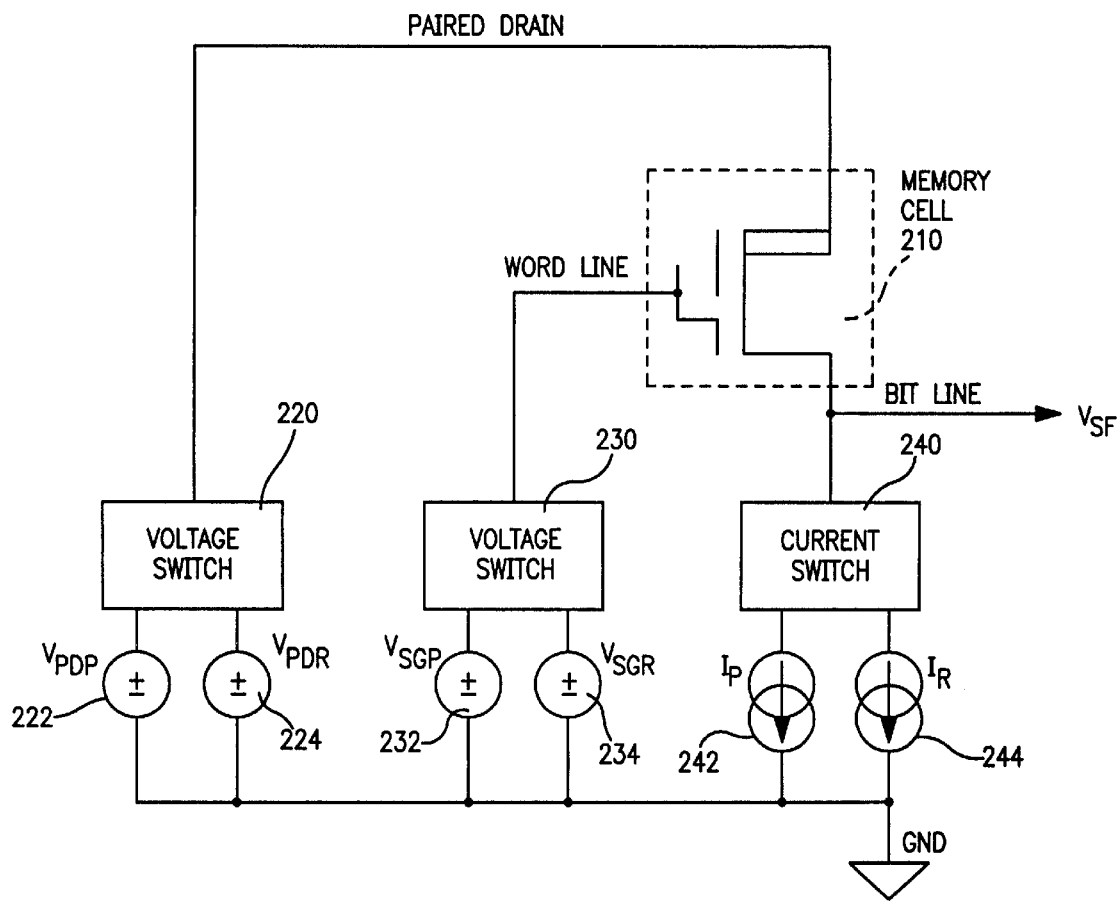
FIG. 2 is a diagram illustrating a flash memory cell having program and read circuits according to one embodiment of the invention.

FIG. 2 is a diagram illustrating a circuit including a flash memory cell and program and read circuits according to one embodiment of the invention. The circuit has a flash memory cell 210, voltage switches 220 and 230, a current switch 240, voltage sources $V_{PDP}$ 222, $V_{PDR}$ 224, $V_{SGP}$ 232, and $V_{SGR}$ 234, current sources $I_P$ 242 and $I_R$ 244.

The flash memory cell 210 has a paired drain D, a gate G, and a source S terminals, or nodes, connected to the voltage source 220, the source-to-gate voltage source 230, and the current source 240, respectively. In a typical memory array having a plurality of memory cells arranged in a two-dimensional matrix with rows and columns, the gate G terminal corresponds to a word line which is common to all bit cells in a row of the memory array, and the source S terminal corresponds to a bit line which is common to all bit cells in a column of the memory array. The memory cell 210 can be in a program mode or read mode depending on the voltage levels at the voltage levels at the paired drain and word line terminals. The flash memory cell is programmed by applying a high voltage pulse $V_{PDP}$ 222 to the paired drain node, while the wordline node is supplied with a fixed voltage $V_{SGP}$ 232 and the bitline node is sourced by a current $I_P$ 242. The number of electrons on the floating gate will be increased due to source side injection and the floating gate voltage will drop. The absolute value change of the floating gate voltage depends on the programming time, the programming current $I_P$ 242 and the applied voltages $V_{PDP}$ 222 and $V_{SGP}$ 232.

In the program mode, the voltage switches 220 and 230, and the current switch 240 switch to connect the paired drain, the word line, and the bit line to the voltage source $V_{PDP}$ 222, the voltage source $V_{SGP}$ 232, and the current source $I_P$ 242, respectively. In the read mode, the switches 220, 230, and 240 switch to connect the paired drain, the word line, and the bit line to the voltage source $V_{PDR}$ 224, the voltage source $V_{SGR}$ 234, and the current source $I_R$ 244, respectively.

In one embodiment, the current Ip of the current source 242 is either a coarse or a fine current. During programming, the number of electrons on the floating gate is increased due to source side injection and the floating gate voltage drops. The absolute value change of the floating gate voltage depends on the programming time, the programming current Ip and the applied voltages Vsgp and Vpdp. In the read mode, the value of the floating gate voltage is indirectly measured through the source follower voltage Vsf at the bit line terminal.

Figure 3:
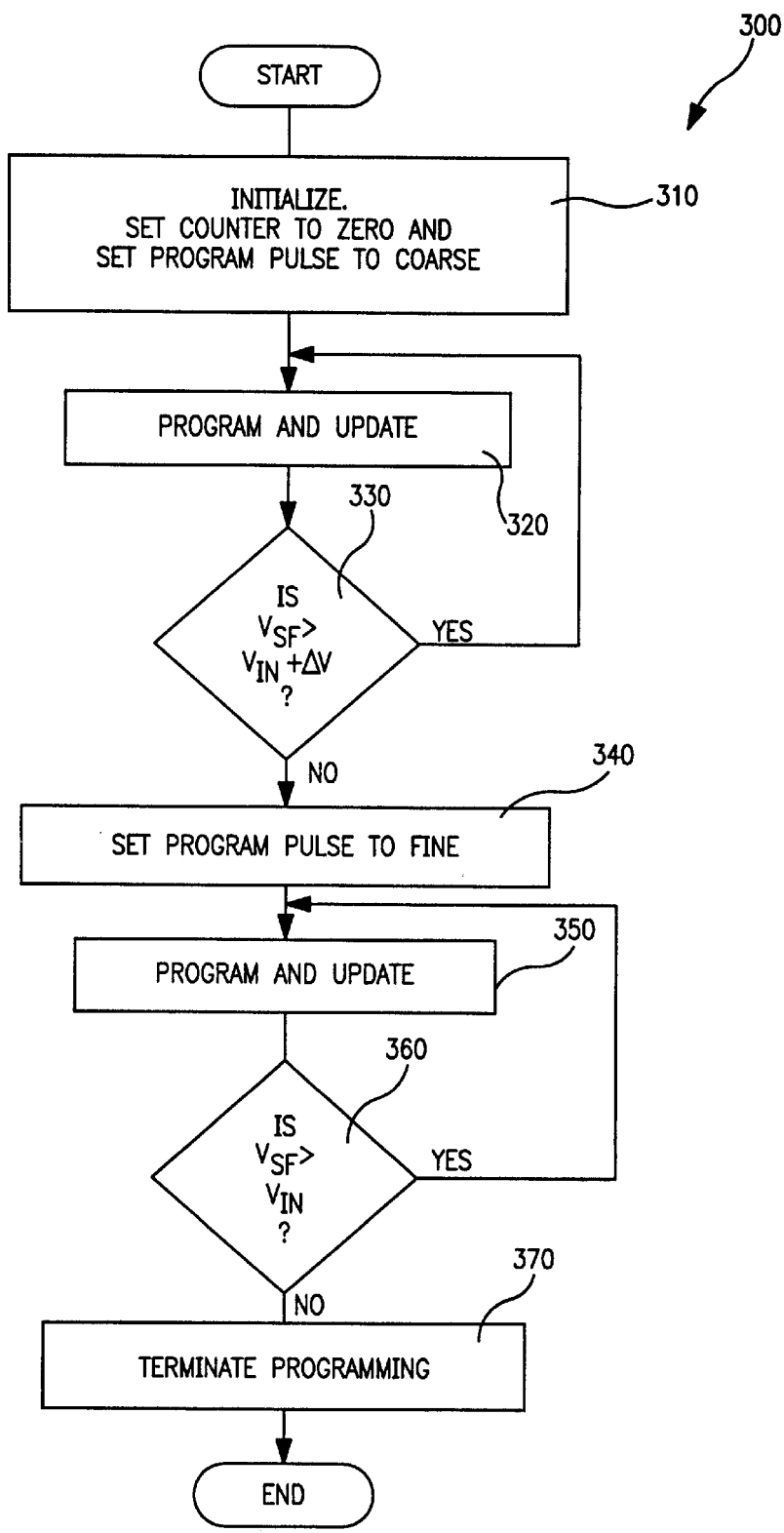
FIG. 3 is a flowchart illustrating a process to program a flash memory cell according to one embodiment of the invention.

FIG. 3 is a flowchart illustrating a process 300 to program a flash memory cell according to one embodiment of the invention.

Upon START, the process 300 initializes the counter to zero and sets the program pulse to generate coarse amplitude (Block 310). Then the process 300 programs and updates the counter (Block 320). The details of block 320 is described in FIG. 4. Next, the process 300 determines if the read cell voltage is greater than the input voltage plus a predetermined amount $\Delta V$ (Block 330). If so, the process 300 goes back to block 320 to continue to provide the coarse pulses. Otherwise, the coarse phase is completed and the process 300 enters the fine phase.

The process 300 sets the program pulse to generate fine amplitude (Block 340). Then, the process 300 programs and updates the counter (Block 350). The details of block 350 is described in FIG. 4. Next, the process 300 determines if the read cell voltage is greater than the input voltage (Block 360). If so, the process 300 returns to block 350 to continue the fine programming phase. Otherwise, the process 300 terminates the programming (Block 370) because the programmed cell voltage has reached close to the input voltage within the tolerance determined by the fine programming amplitude. Then, the process 300 is terminated.

Note that the above process describes a two-stage procedure, coarse and fine. The procedure can be modified to have more than two stages. For example, a coarse, medium, and fine stage can be used with coarse amplitude, medium amplitude, and fine amplitude, respectively.

Figure 4:
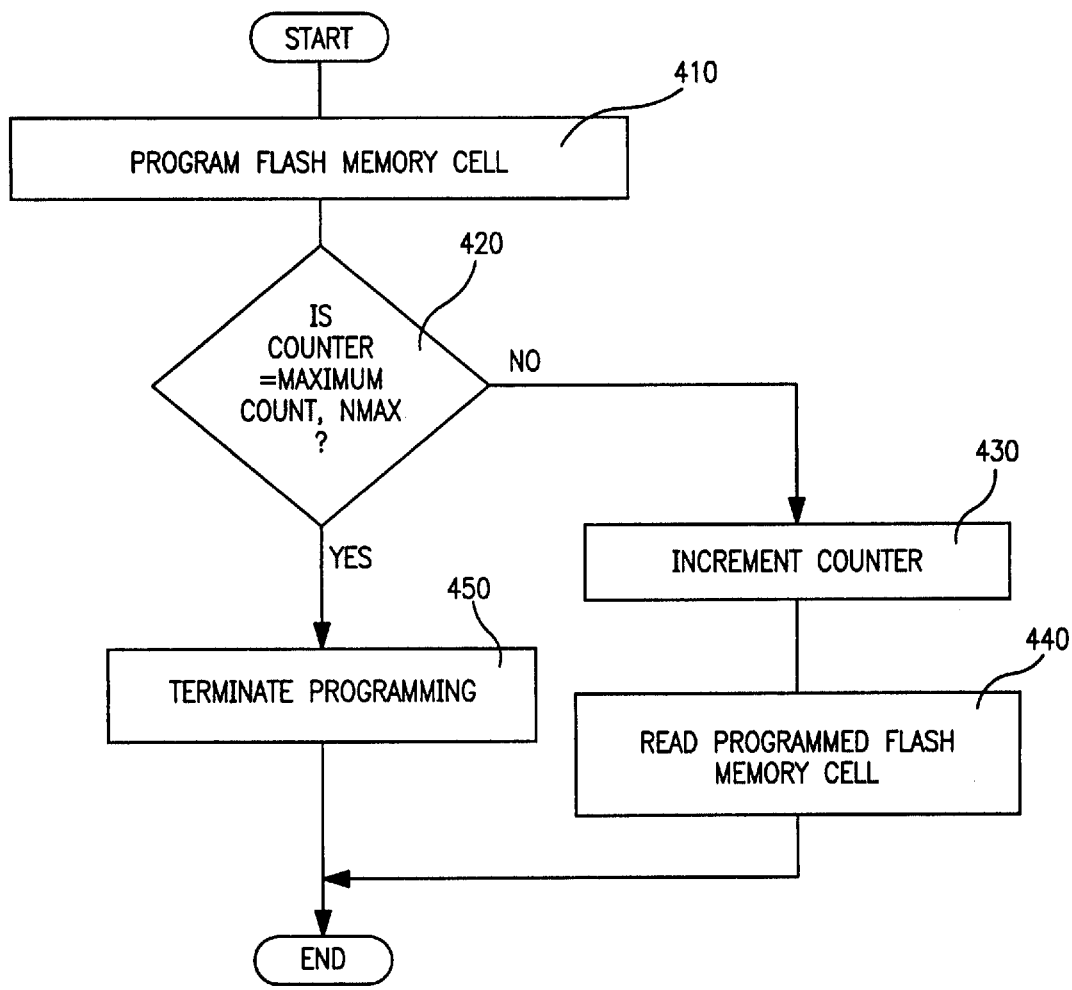
FIG. 4 is a flowchart illustrating a process to program and update according to one embodiment of the invention.

FIG. 4 is a flowchart illustrating a process 320 or 350 to program and update according to one embodiment of the invention.

Upon START, the process 320/350 programs the flash memory cell (Block 410) by applying the proper voltages at the paired drain terminal of the memory cell. This program voltage is either coarse or fine voltage. Then the process 320/350 determines if the counter has reached a predetermined maximum count NMAX (Block 420). If so, the process 320/350 terminates the programming (Block 450) and is then terminated. Otherwise, the process 320/350 updates the counter by incrementing by one (Block 430). Next, the process 320/350 reads the programmed memory cell to provide a cell voltage (Block 440). Then, the process 320/350 is terminated.

Figure 5:
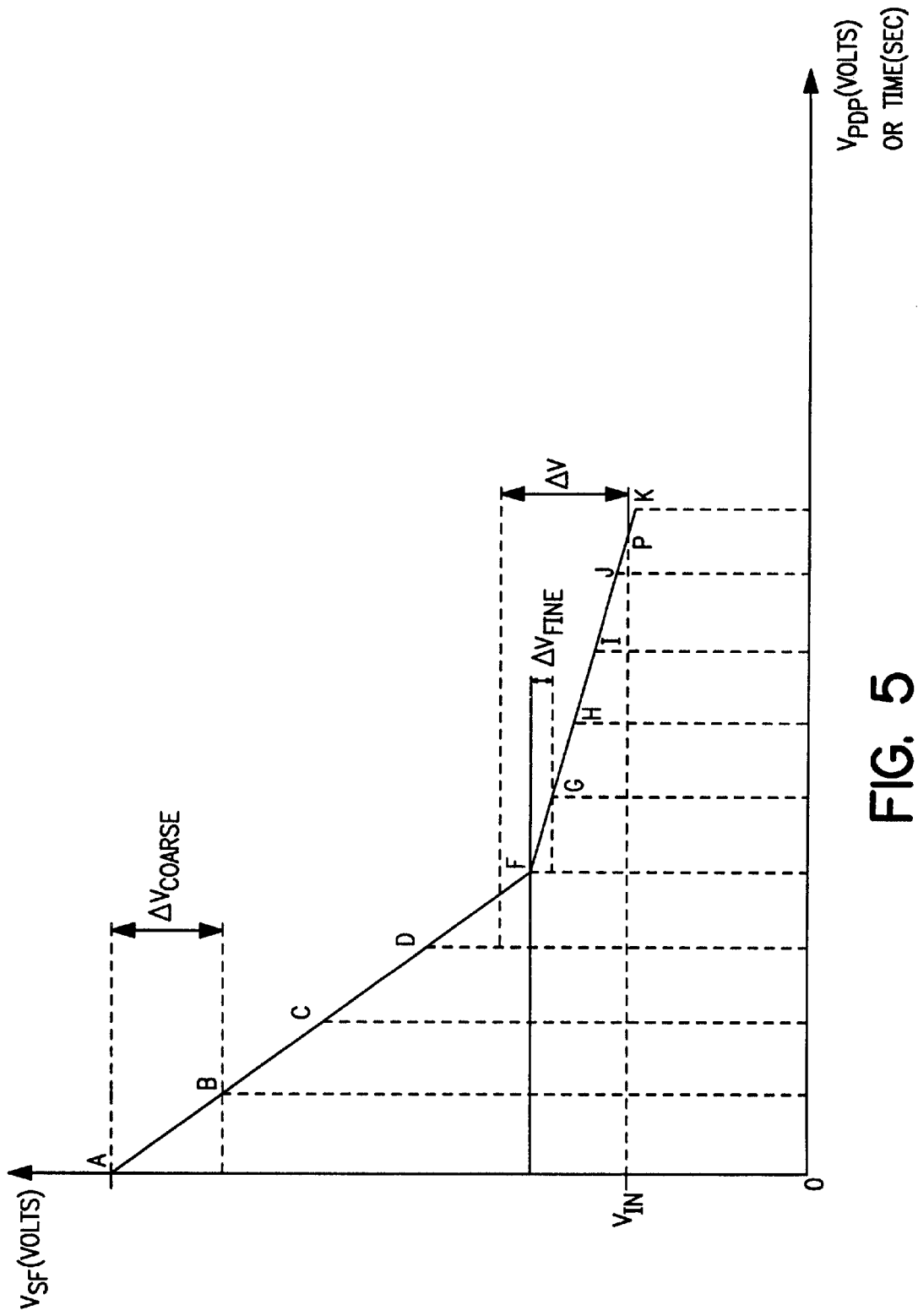
FIG. 5 is a diagram illustrating a coarse and fine program curve according to one embodiment of the invention.

FIG. 5 is a diagram illustrating a coarse and fine program curve according to one embodiment of the invention. The vertical axis corresponds to the cell voltage Vsf as read by the read circuit. The horizontal axis corresponds to the program voltage or the time.

The program curve consists of two linear segments: a coarse segment AF and a fine segment FK corresponding to the coarse and fine stages. The coarse segment AF consists of segments AB, BC, CD, and DF, each corresponding to the coarse program voltage $\Delta V_{coarse}$. The fine segment FK consists of segments FG, GH, HI, IJ, and JK, each corresponding to the fine program voltage $\Delta V_{fine}$. The input voltage VIN intersects the fine segment FK at point P. The predetermined voltage for comparison during the coarse programming is $\Delta V$. This voltage $\Delta V$ is typically more than $\Delta V_{coarse}$.

The programming starts from the high voltage and gradually goes down to the input voltage VIN. Initially, the programming starts at point A. The program pulse is set to result in a coarse amplitude at the coarse voltage $\Delta V_{coarse}$. The coarse program sequence goes from A to B, then C, D, and F. Each time the programming goes toward the input voltage VIN, a comparison between the read cell voltage Vsf and the VIN+$\Delta V$ is made. If Vsf is greater than VIN+$\Delta V$, the coarse programming continues. When it reaches F, the comparison indicates Vsf is less than VIN+$\Delta V$, therefore, the programming is switched to the fine programming mode. The program voltage is now set to result in a fine amplitude of fine voltage now $\Delta V_{fine}$ and the Vsf goes down from F to G, then H, I, J, and K. Each time the programming goes toward the input voltage VIN, a comparison is made between the read cell voltage Vsf and VIN. If Vsf is greater than VIN, the fine programming continues. When it reaches K, the comparison indicates that Vsf is less than VIN, therefore, the programming is terminated.

Since the program voltage changes incrementally at $\Delta V_{fine}$ increments (or decrements), when the programming is terminated, the cell voltage Vsf differs at most the VIN by the fine voltage $\Delta V_{fine}$. This fine voltage is carefully chosen so that the programmed cell voltage is very close to the input voltage VIN.

While this invention has been described with reference to illustrative embodiments, this description is not intended to be construed in a limiting sense. Various modifications of the illustrative embodiments, as well as other embodiments of the invention, which are apparent to persons skilled in the art to which the invention pertains are deemed to lie within the spirit and scope of the invention.

What is claimed is:

1. An apparatus comprising:
a read circuit to read a cell voltage of a flash memory cell;
a comparator coupled to the flash memory cell to compare the read cell voltage with an input voltage representing an analog signal, the comparator generating first and second comparison results; and
a programming circuit to generate a first program pulse corresponding to a first amplitude to iteratively program the flash memory cell based on the first comparison result, the programming circuit generating a second program pulse corresponding to a second amplitude less than the first amplitude to iteratively program the flash memory cell based on the first and second comparison results.

2. The apparatus of claim 1 further comprising:
a counter to determine number of program pulses applied to the flash memory cell.

3. The apparatus of claim 2 wherein the programming circuit terminates programming the flash memory cell when the number of program pulses reaches a predetermined maximum count.

4. The apparatus of claim 1 wherein the first comparison result indicates if the read cell voltage is greater than the input voltage by a predetermined amount.

5. The apparatus of claim 4 wherein the second comparison result indicates if the read cell voltage is greater than the input voltage.

6. The apparatus of claim 5 wherein the programming circuit terminates programming the flash memory cell when the read cell voltage is less than the input voltage according to the second comparison result.

7. A method comprising:

reading a cell voltage of a flash memory cell;

comparing the read cell voltage with an input voltage representing an analog signal to generate first and second comparison results;

generating a first program pulse corresponding to a first amplitude to iteratively program the flash memory cell based on the first comparison result; and generating a second program pulse corresponding to a second amplitude less than the first amplitude to iteratively program the flash memory cell based on the first and second comparison results.

8. The method of claim 7 further comprising:

determining number of program pulses applied to the flash memory cell.

9. The method of claim 8 further comprising terminating programming the flash memory cell when the number of program pulses reaches a predetermined maximum count.

10. The method of claim 7 wherein the first comparison result indicates if the read cell voltage is greater than the input voltage by a predetermined amount.

11. The method of claim 10 wherein the second comparison result indicates if the read cell voltage is greater than the input voltage.

12. The method of claim 11 further comprising terminating programming the flash memory cell when the read cell voltage is less than the input voltage according to the second comparison result.

13. A system comprising:

a flash memory cell to store an input voltage representing an analog signal;

a circuit coupled to the flash memory cell comprising:

a read circuit to read a cell voltage of the flash memory cell, a comparator coupled to the flash memory cell to compare the read cell voltage with the input voltage, the comparator generating first and second comparison results, and a programming circuit to generate a first program pulse corresponding to a first amplitude to iteratively program the flash memory cell based on the first comparison result, the programming circuit generating a second program pulse corresponding to a second amplitude less than the first amplitude to iteratively program the flash memory cell based on the first and second comparison results.

14. The system of claim 13 wherein the circuit further comprises:

a counter to determine number of program pulses applied to the flash memory cell.

15. The system of claim 14 wherein the programming circuit terminates programming the flash memory cell when the number of program pulses reaches a predetermined maximum count.

16. The system of claim 15 wherein the second comparison result indicates if the read cell voltage is greater than the input voltage.

17. The system of claim 16 wherein the programming circuit terminates programming the flash memory cell when the read cell voltage is less than the input voltage according to the second comparison result.

18. The system of claim 13 wherein the first comparison result indicates if the read cell voltage is greater than the input voltage by a predetermined amount.

* * * * *